United States Patent
Kim et al.

(10) Patent No.: US 6,849,525 B2
(45) Date of Patent: Feb. 1, 2005

(54) METHODS FOR FORMING POLYCRYSTALLINE SILICON LAYER AND FABRICATING POLYCRYSTALLINE SILICON THIN FILM TRANSISTOR

(75) Inventors: Binn Kim, Seoul (KR); Hae-Yeol Kim, Anyang-si (KR); Jong-Uk Bae, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/465,786

(22) Filed: Jun. 20, 2003

(65) Prior Publication Data

US 2004/0203218 A1 Oct. 14, 2004

(Under 37 CFR 1.47)

(30) Foreign Application Priority Data

Nov. 4, 2002 (KR) .................. 10-2002-0067881

(51) Int. Cl.⁷ ............................................... H01L 21/30
(52) U.S. Cl. ...................................................... 438/486
(58) Field of Search ................................. 438/149, 150, 438/151, 166, 466, 479, 482, 486, 487, 488

(56) References Cited

U.S. PATENT DOCUMENTS

| | | | |
|---|---|---|---|
| 5,501,989 A | 3/1996 | Takayama et al. | |
| 5,550,070 A | 8/1996 | Funai et al. | |
| 5,580,792 A | 12/1996 | Zhang et al. | |
| 5,612,250 A | 3/1997 | Ohtani et al. | |
| 5,624,851 A | 4/1997 | Takayama et al. | |
| 6,084,247 A | 7/2000 | Yamazaki et al. | |
| 6,309,951 B1 * | 10/2001 | Jang et al. | 438/486 |
| 6,531,348 B2 * | 3/2003 | Kim et al. | 438/166 |
| 6,558,986 B1 * | 5/2003 | Choi | 438/149 |

OTHER PUBLICATIONS

Pelant, I. et al., "Electric–field–enhanced metal–induced crystallization of hydrogenated amorphous silicon at room temperature," Appl. Phys A 74, pp 557–560. Jun. 27, 2001.*

Song, Kyung–Sub et al. "Electric Field Effect on the Metal Induced Crystallization of Amorphous Silicon," Electrochemical Society Proceedings, vol. 97–23; pp 75–80, 1997.*

* cited by examiner

Primary Examiner—Carl Whitehead, Jr.
Assistant Examiner—Jennifer M Dolan
(74) Attorney, Agent, or Firm—McKenna Long & Aldridge LLP (57) ABSTRACT

A method of forming a polycrystalline silicon layer includes: forming an amorphous silicon layer on a substrate; depositing a catalyst metal on the amorphous silicon layer; disposing first and second electrodes contacting the amorphous silicon layer along a first direction; heating the amorphous silicon layer under a first temperature and simultaneously applying a first voltage to the first and second electrodes to form a first crystallized amorphous silicon layer; disposing third and fourth electrodes contacting the first crystallized amorphous silicon layer along a second direction, the second direction being different from the first direction; and heating the first crystallized amorphous silicon layer under a second temperature and simultaneously applying a second voltage to the third and fourth electrodes to form a secondly crystallized amorphous silicon layer.

36 Claims, 7 Drawing Sheets

METHODS FOR FORMING POLYCRYSTALLINE SILICON LAYER AND FABRICATING POLYCRYSTALLINE SILICON THIN FILM TRANSISTOR

This application claims the benefit of Korean Patent Application No. 2002-67881, filed on Nov. 4, 2002, which is hereby incorporated by reference for all purposes as if fully set forth herein.

BACKGROUND OF THE INVENTION

1. Field of the Invention

The present invention relates to a polycrystalline silicon thin film transistor for a liquid crystal display (LCD) device, and more particularly to a method for forming a polycrystalline silicon layer having a uniform grain distribution.

2. Discussion of the Related Art

In a conventional process for forming a polycrystalline silicon layer, an intrinsic amorphous silicon layer is formed on an insulating substrate by using a plasma chemical vapor deposition (PCVD) method or a low pressure chemical vapor deposition (LPCVD) method. When the amorphous silicon layer has a thickness of about 500 Å, it is crystallized into a polycrystalline silicon layer by a crystallization method. The crystallization method is generally either a laser annealing method, a solid phase crystallization (SPC) method or a metal induced crystallization (MIC) method.

In the laser annealing method, an excimer laser beam is applied to an amorphous silicon layer on an insulating substrate to form a polycrystalline silicon layer. In the SPC method, a heat-treatment is applied to an amorphous silicon layer at a high temperature for a time period sufficient to form a polycrystalline silicon layer. In the MIC method, a metal layer is formed on the amorphous silicon layer. The metal layer is used as a crystallization seed in a subsequent heat-treatment to form a polycrystalline silicon layer. In the MIC method, a large-sized glass substrate may be used as the insulating substrate because the heat-treatment in the MIC method is below 600° C.

The laser annealing method has recently become a more prevalent method in forming a polycrystalline silicon layer. The laser annealing method includes forming an amorphous silicon layer on an insulating substrate and then melting the amorphous silicon layer with a laser. Subsequently, the melted amorphous silicon layer is cooled to form a polycrystalline silicon layer.

The SPC method includes forming a buffer layer on a quartz substrate that can withstand temperatures higher than 600° C. (degrees Celsius). The buffer layer prevents contamination from the quartz substrate. Next, an amorphous silicon layer is deposited on the buffer layer and is heated in a furnace at a high temperature for a long time period to form a polycrystalline silicon layer. However, the heat-treatment of the amorphous silicon layer performed at a high temperature for a long time period can not obtain a desirable polycrystalline silicon phase, because the direction of grain growth is irregular. Thus, a gate insulating layer contacting the polycrystalline silicon layer is also irregularly formed when the irregularly formed polycrystalline silicon layer is used in a thin film transistor (TFT). Accordingly, the breakdown voltage of the gate insulating layer decreases. Further, because the grain size of the polycrystalline silicon layer is not uniform, the carrier mobility of the TFT is lowered. Furthermore, a quartz substrate should be used to withstand the high temperatures increasing the substrate cost.

The MIC method forms a polycrystalline layer by using a large-sized glass substrate that has a low cost. However, the quality of the polycrystalline silicon layer is deficient because of the possibility that a metal residue remains in the polycrystalline silicon layer. Accordingly, a field enhanced metal induced crystallization (FE-MIC) method that improves the MIC method is suggested. In the FE-MIC method, after a metal layer is formed on an amorphous silicon layer, a direct current (DC) high voltage is applied to the metal layer to generate heat. Because the metal layer functions as a catalyst, the metal is referred to as a catalyst metal in a MIC method.

FIGS. 1A to 1D are schematic perspective views showing a crystallization process of an amorphous silicon layer using a field enhanced metal induced crystallization method according to the related art.

Figure 1A:
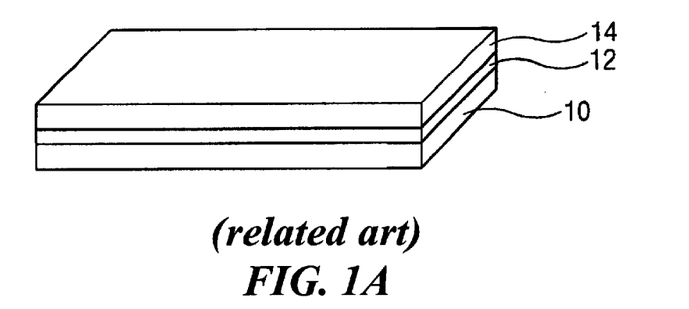
FIGS. 1A to 1D are schematic perspective views showing a crystallization process of an amorphous silicon layer using a field enhanced metal induced crystallization method according to the related art.

In FIG. 1A, a buffer layer 12 is formed on a substrate 10 by depositing an insulating layer such as silicon oxide ($SiO_2$). Because the buffer layer 12 prevents the eruption of alkaline materials from the substrate 10, the buffer layer 12 can be used more effectively when the substrate includes the alkaline materials. After amorphous silicon is deposited on the buffer layer 12, an amorphous silicon layer 14 is formed through a dehydrogenation process. The dehydrogenation process for eliminating hydrogen from the amorphous silicon layer 14 may be omitted according to the deposition condition of amorphous silicon.

Figure 1B:
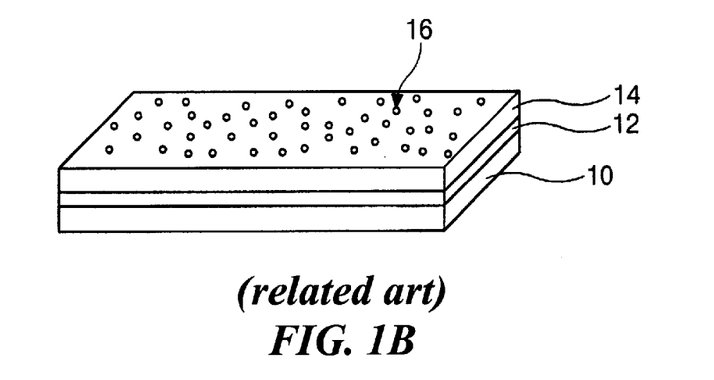

In FIG. 1B, a catalyst metal 16 such as nickel (Ni) is deposited on the amorphous silicon layer 14.

Figure 1C:
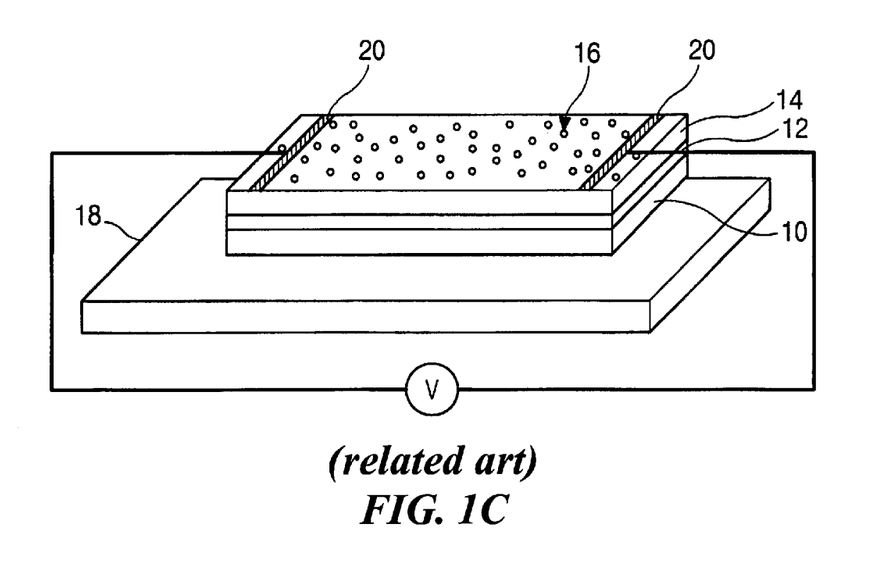

In FIG. 1C, after the substrate 10 including the amorphous silicon layer 14 is loaded on a heater 18, electrodes 20 contacting two facing ends of the amorphous silicon layer 14 are disposed thereon. The amorphous silicon layer 14 is crystallized by applying a high voltage to the amorphous silicon layer 14 through the electrodes 20.

Figure 1D:
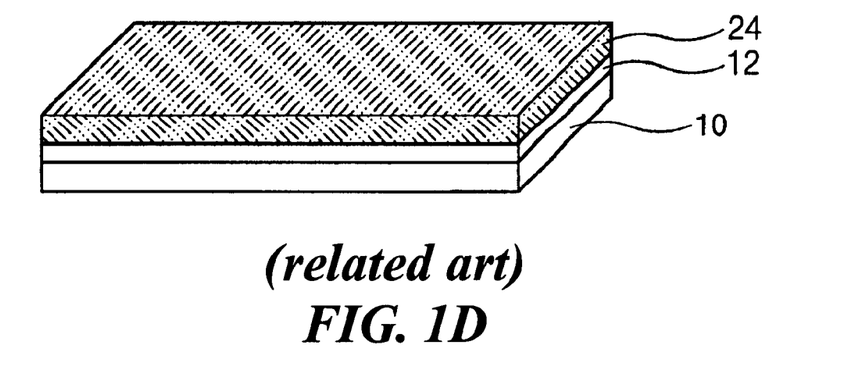

As shown in FIG. 1D, a polycrystalline silicon layer 24 is obtained through a field enhanced metal induced crystallization (FE-MIC) method illustrated in FIGS. 1A to 1C.

However, because the electrodes are disposed at opposite ends of the amorphous silicon layer, an electric field is generated along a direction. Thus, a current between the electrodes flows along this direction and is non-uniformly distributed. Accordingly, the grain of the polycrystalline silicon layer grows along the direction and the grain distribution of the polycrystalline silicon layer becomes non-uniform. When a thin film transistor is formed by using the polycrystalline silicon layer as an active layer, this non-uniform grain distribution results in decreased performance such as a high OFF current.

SUMMARY OF THE INVENTION

The present invention is directed to a polycrystalline thin film transistor for a liquid crystal display device that substantially obviates one or more of problems due to limitations and disadvantages of the related art.

An advantage of the present invention is to provide a polycrystalline thin film transistor for a liquid crystal display device that has improved electrical characteristics.

Another advantage of the present invention is to provide a method of forming a polycrystalline silicon layer with a more uniform grain distribution.

Additional features and advantages of the invention will be set forth in the description that follows, and in part will be apparent from the description, or may be learned by practice of the invention. Other advantages of the invention will be realized and attained by the structure particularly pointed out in the written description and claims hereof as well as the appended drawings.

To achieve these and other advantages and in accordance with the purpose of the present invention, as embodied and broadly described, a method of forming a polycrystalline silicon layer includes: forming an amorphous silicon layer on a substrate; depositing a catalyst metal on the amorphous silicon layer; disposing first and second electrodes contacting the amorphous silicon layer along a first direction; heating the amorphous silicon layer under a first temperature and simultaneously applying a first voltage to the first and second electrodes to form a first crystallized amorphous silicon layer; disposing third and fourth electrodes contacting the first crystallized amorphous silicon layer along a second direction, the second direction may be substantially perpendicular to the first direction; and heating the first crystallized amorphous silicon layer under a second temperature and simultaneously applying a second voltage to the third and fourth electrodes to form a secondly crystallized amorphous silicon layer.

In another aspect, a method of forming a polycrystalline silicon layer includes: forming an amorphous silicon layer on a substrate; depositing a catalyst metal on the amorphous silicon layer; disposing first, second, third and fourth electrodes contacting the amorphous silicon layer such that the first and second electrodes are disposed along a first direction and the third and fourth electrodes are disposed along a second direction, the second direction being substantially perpendicular to the first direction; and heating the amorphous silicon layer under a temperature and simultaneously applying a first voltage to the first and second electrodes and a second voltage to the third and fourth electrodes.

In another aspect, a method of forming a polycrystalline silicon thin film transistor includes: forming an amorphous silicon layer on a substrate; depositing a catalyst metal on the amorphous silicon layer; disposing first and second electrodes contacting the amorphous silicon layer along a first direction; heating the amorphous silicon layer under a first temperature and simultaneously applying a first voltage to the first and second electrodes to form a first crystallized amorphous silicon layer; disposing third and fourth electrodes contacting the first crystallized amorphous silicon layer along a second direction, the second direction being substantially perpendicular to the first direction; heating the first crystallized amorphous silicon layer under a second temperature and simultaneously applying a second voltage to the third and fourth electrodes to form a polycrystalline silicon layer; patterning the polycrystalline silicon layer to form an active layer; forming a gate insulating layer on the active layer; forming a gate electrode on the gate insulating layer; doping the active layer with impurities to form source and drain regions in the active layer; forming an interlayer insulating layer on the gate electrode, the interlayer insulating layer having source contact hole exposing the source region and drain contact hole exposing the drain region; and forming source and drain electrodes on the interlayer insulating layer, the source electrode being connected to the source region through the source contact hole, the drain electrode being connected to the drain region through the drain contact hole.

In another aspect, a method of forming a polycrystalline silicon thin film transistor includes: forming an amorphous silicon layer on a substrate; depositing a catalyst metal on the amorphous silicon layer; disposing first, second, third and fourth electrodes contacting the amorphous silicon layer such that the first and second electrodes are disposed along a first direction and the third and fourth electrodes are disposed along a second direction, the second direction being substantially perpendicular to the first direction; heating the amorphous silicon layer under a temperature and simultaneously applying a first voltage to the first and second electrodes and a second voltage to the third and fourth electrodes to form a polycrystalline silicon layer; patterning the polycrystalline silicon layer to form an active layer; forming a gate insulating layer on the active layer; forming a gate electrode on the gate insulating layer; doping the active layer with impurities to form source and drain regions in the active layer; forming an interlayer insulating layer on the gate electrode, the interlayer insulating layer having source contact hole exposing the source region and drain contact hole exposing the drain region; and forming source and drain electrodes on the interlayer insulating layer, the source electrode being connected to the source region through the source contact hole, the drain electrode being connected to the drain region through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included herewith to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, similar reference numbers will be used throughout the drawings to refer to the same or like parts.

FIGS. 2A to 2D are schematic perspective views showing a process of forming a polycrystalline silicon layer according to an embodiment of the present invention.

Figure 2A:
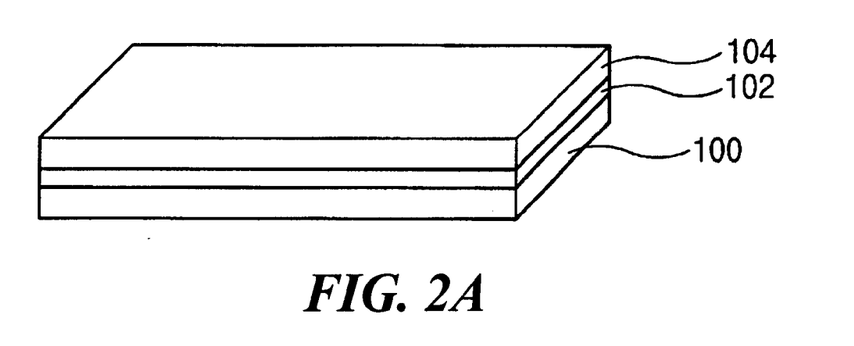
FIGS. 2A to 2D are schematic perspective views showing a process of forming a polycrystalline silicon layer according to an embodiment of the present invention.

In FIG. 2A, a buffer layer 102 may be formed on a substrate 100 by depositing an insulating layer such as silicon oxide ($SiO_2$) or silicon nitride ($SiN_x$). Because the buffer layer 102 prevents eruption of alkaline materials from the substrate 100, the buffer layer 102 may be used more effectively when the substrate includes the alkaline materials. After amorphous silicon (a-Si:H) is deposited on the buffer layer 102, an amorphous silicon layer 104 may be formed through a dehydrogenation process. In general, hydrogen in the amorphous silicon may be erupted with a temperature over about 350° C. and a crystallization process is performed with a temperature over about 350° C. Thus, the hydrogen in the amorphous silicon layer may be erupted during the crystallization process, thereby creating many defects in a polycrystalline silicon layer. Accordingly, the dehydrogenation process may be performed before the crystallization process to eliminate the hydrogen from the amorphous silicon layer in advance. The dehydrogenation process for eliminating hydrogen from the amorphous silicon layer 104 may be omitted according to the deposition condition of amorphous silicon.

Figure 2B:
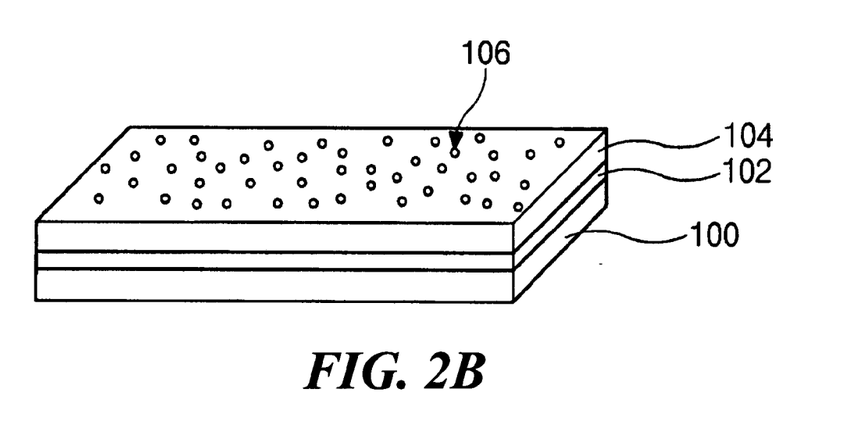

In FIG. 2B, a catalyst metal 106 such as nickel (Ni) may be deposited on the amorphous silicon layer 104. Extremely small quantities of the catalyst metal 106 may be used for crystallization. The catalyst metal 106 may be combined with silicon of the amorphous silicon layer 104 to form metal silicide (not shown). The metal silicide functions as a seed for crystallization.

Figure 2C:
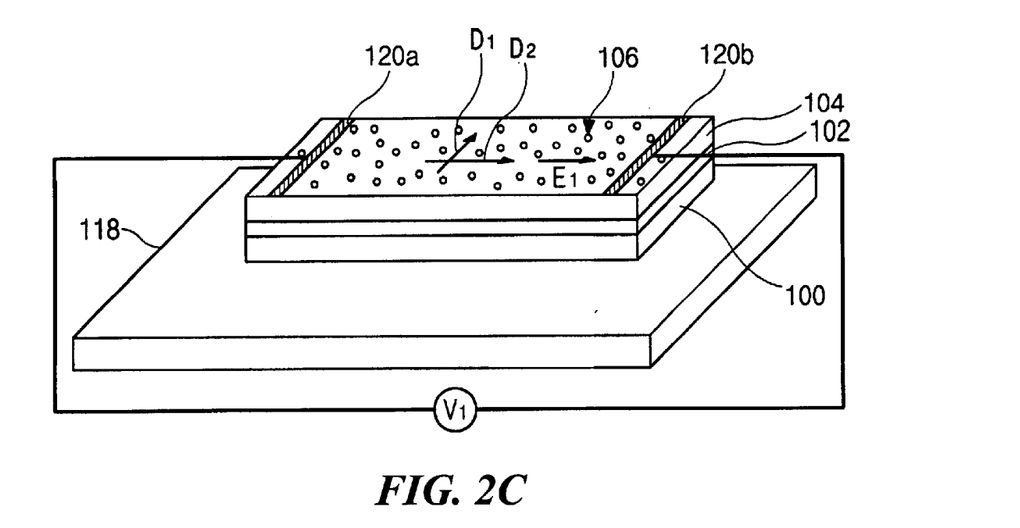

In FIG. 2C, after the substrate 100 including the amorphous silicon layer 104 is loaded on a heater 118, first and second electrodes 120a and 120b contacting the amorphous silicon layer 104 may be disposed along a first direction "$D_1$." The first and second electrodes 120a and 120b may be a rod shaped and may be substantially parallel to and spaced apart from each other. Next, the amorphous silicon layer 104 may be heated by the heater 118 under a first temperature to form a first crystallized amorphous silicon layer 122 (of FIG. 2D). The first temperature may be within a range of about 450° C. to about 600° C. Simultaneously, a first voltage from a first power supply "$V_1$" may be applied to the amorphous silicon layer 104 through the first and second electrodes 120a and 120b. The first voltage may be less than 10,000 V. In one embodiment the voltage applied is within a range of about 500 V to about 2000 V. Accordingly, a first electric field "$E_1$" may be generated along a second direction "$D_2$" substantially perpendicular to the first direction "$D_1$" and the diffusion of the metal silicide along the second direction "$D_2$" may be enhanced by the first electric field "$E_1$."

Figure 2D:
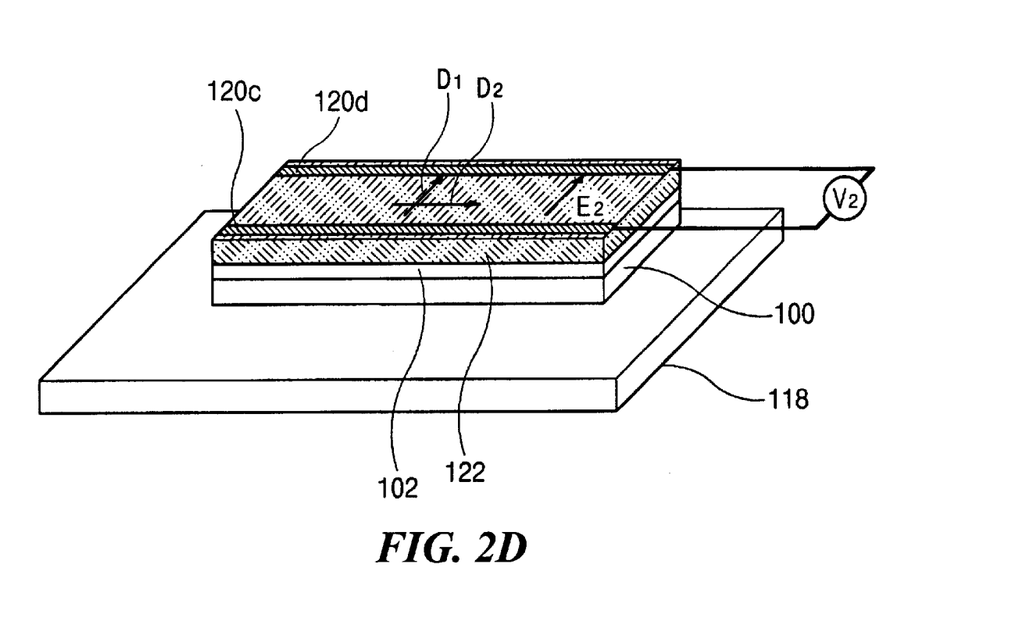

In FIG. 2D, third and fourth electrodes 120c and 120d contacting the first crystallized amorphous silicon layer 122 may be disposed along the second direction "$D_2$." The third and fourth electrodes 120c and 120d may be rod shape of and may be substantially parallel to and spaced apart from each other. Next, the first crystallized amorphous silicon layer 122 may be heated by the heater 118 under a second temperature to form a secondly crystallized amorphous silicon layer, i.e., a polycrystalline silicon layer. The second temperature may be within a range of about 450° C. to about 600° C. Simultaneously, a second voltage from a second power supply "$V_2$" may be applied to the first crystallized amorphous silicon layer 122 through the third and fourth electrodes 120c and 120d. The second voltage may be less than 10,000 V. In one embodiment the second voltage applied is within a range of about 500 V to about 2000 V. Accordingly, a second electric field "$E_2$" may be generated along the first direction "$D_1$" and a diffusion of the metal silicide along the first direction "$D_1$" maybe enhanced by the second electric field "$E_2$." Since the metal silicide may be diffused along the first and second directions "$D_1$" and "$D_2$," grains of the polycrystalline silicon layer grow along the first and second directions "$D_1$" and "$D_2$" and are uniformly distributed. Therefore, a thin film transistor using the polycrystalline silicon layer has improved electrical characteristics.

Figure 3:
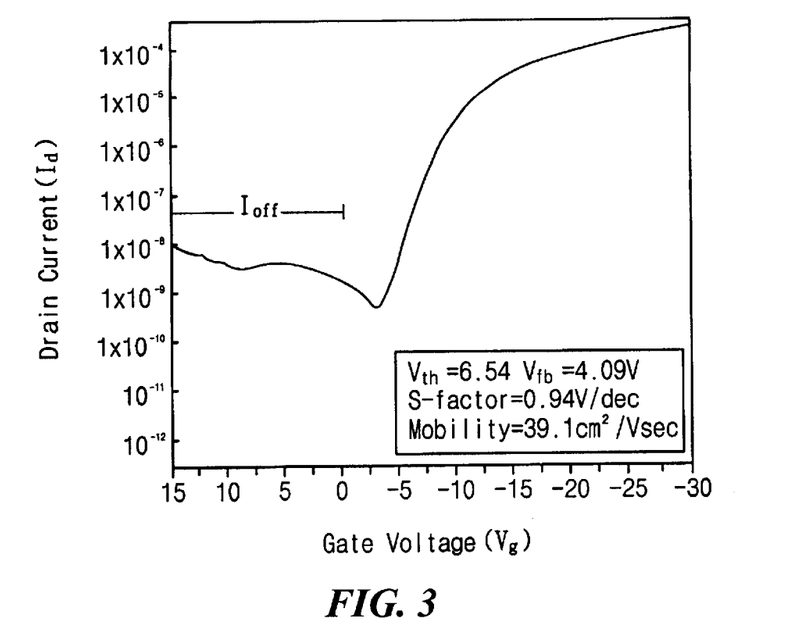
FIG. 3 is a graph showing electrical characteristics of a polycrystalline silicon thin film transistor according to the related art.
Figure 4:
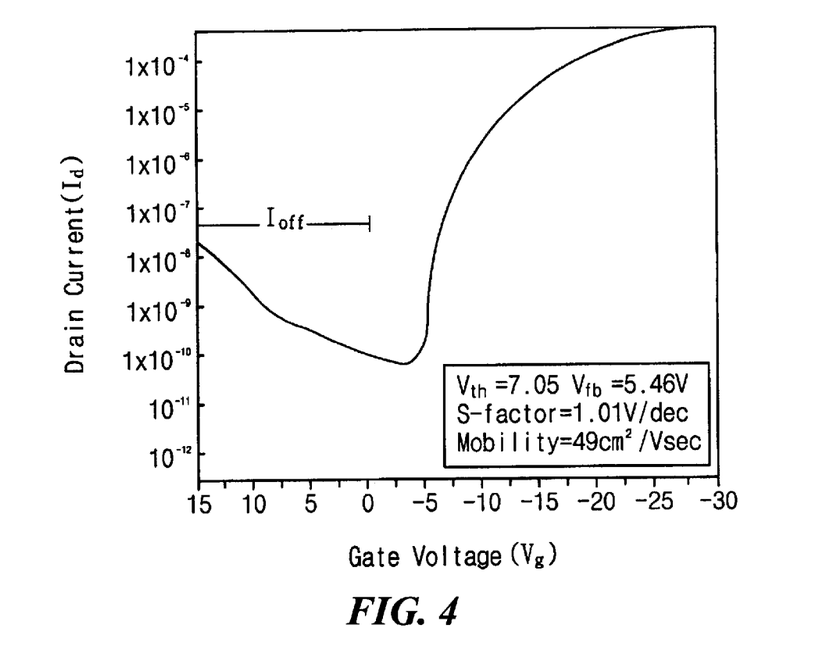
FIG. 4 is a graph showing electrical characteristics of a polycrystalline silicon thin film transistor according to an embodiment of the present invention.

FIG. 3 is a graph showing the electrical characteristics of a polycrystalline silicon thin film transistor according to the related art and FIG. 4 is a graph showing electrical characteristics of a polycrystalline silicon thin film transistor according to an embodiment of the present invention. In FIGS. 3 and 4, a drain current "Id" is measured according to a gate voltage "$V_g$" with a drain-source voltage "$V_{DS}$" fixed at −10 V.

The mobility of the polycrystalline silicon thin film transistor (TFT) is about 49 $cm^2$/V-sec in FIG. 4, while the mobility of the polycrystalline silicon TFT is about 39.1 $cm^2$/V-sec in FIG. 3. Moreover, the drain current "Id" with the gate voltage "$V_g$" between 10 V to 0 V, which is referred to as an OFF current "$I_{off}$," is reduced in FIG. 4 as compared with in FIG. 3. Therefore, electrical characteristics of a polycrystalline silicon TFT are improved by sequentially applying the electric field along the first and second directions during the crystallization process.

Figure 5:
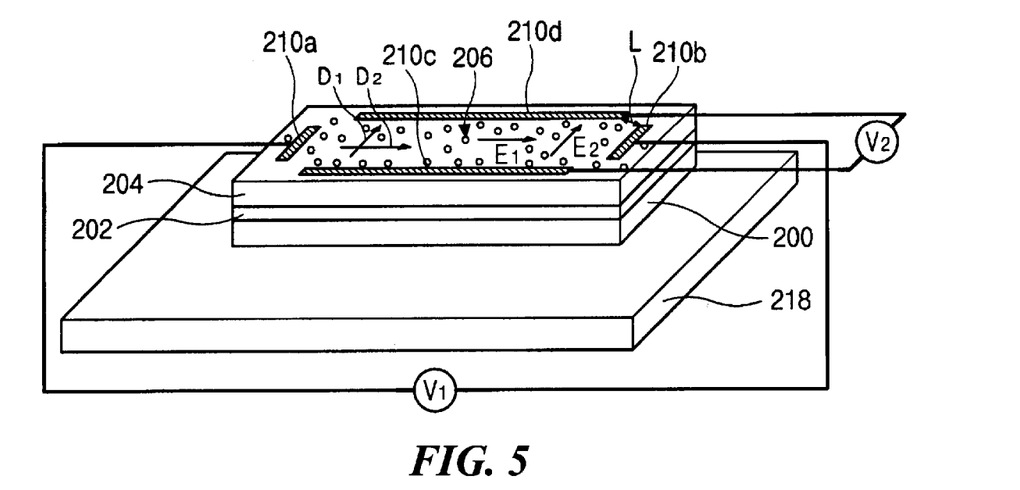
FIG. 5 is a schematic perspective view showing a structure of electrodes for a process of forming a polycrystalline silicon layer according to another embodiment of the present invention.

FIG. 5 is a schematic perspective view showing a structure of electrodes for a process of forming a polycrystalline silicon layer according to another embodiment of the present invention.

In FIG. 5, a buffer layer 202 may be formed on a substrate 200 and an amorphous silicon layer 204 may be formed on the buffer layer 202. A catalyst metal 206 may be deposited on the amorphous silicon layer 204, and the substrate 200 including the amorphous silicon layer 204 may be loaded on a heater 218. First and second electrodes 210a and 210b contacting the amorphous silicon layer 204 may be disposed along a first direction "$D_1$," and third and fourth electrodes 210c and 210d contacting the amorphous silicon layer 204 may be disposed along a second direction "$D_2$" different from the first direction "$D_1$." In another embodiment of the present invention, the second direction may also be substantially perpendicular to the first direction. The first, second, third and fourth electrodes 210a, 210b, 210c and 210d are spaced apart from each other. For example, one end of the second electrode 210b may be spaced apart from one end of the fourth electrode 210d by a distance "L" within a range of about 5 cm to 7 cm. As the second electrode 210b approaches the fourth electrode 210d, an electric field intensity between the second and fourth electrodes 210b and 210d becomes more prevalent than electric field intensities between the first and second electrodes 210a and 210b, and between the third and fourth electrodes 210c and 210d. Accordingly, the effectiveness of crystallization may be reduced. Further, the first and second electrodes 210a and 210b may be connected to a first power supply "$V_1$," and the third and fourth electrodes 210c and 210d may be connected to a second power supply "$V_2$" so that independent optimum voltages may be applied for crystallization.

Figure 6:
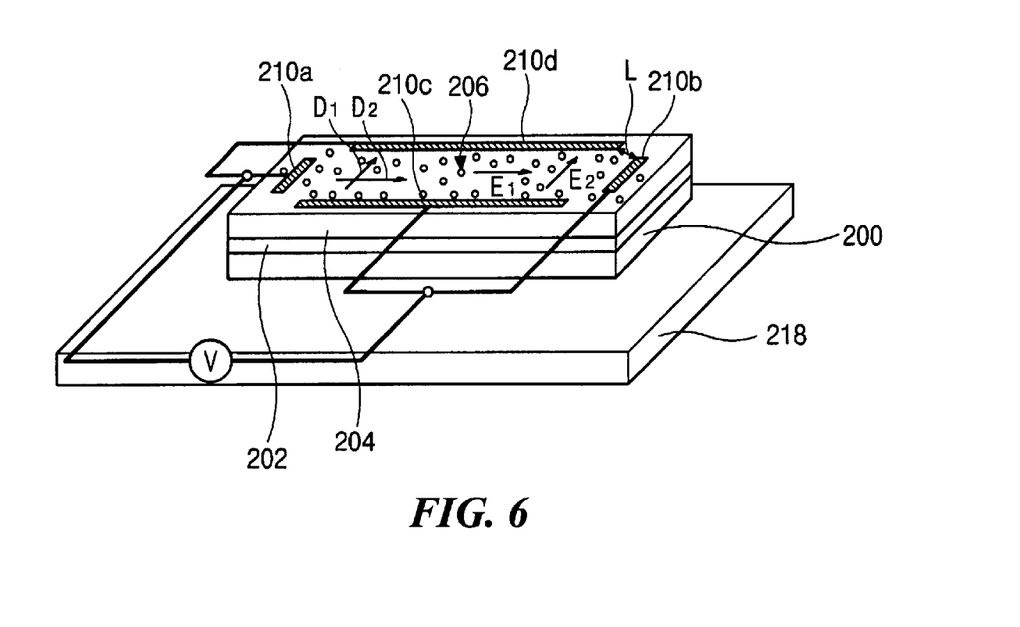
FIG. 6 is a schematic perspective view showing a structure of electrodes for a process of forming a polycrystalline silicon layer according to a third embodiment of the present invention.

FIG. 6 is a schematic perspective view showing the structure of electrodes for a process of forming a polycrystalline silicon layer according to a third embodiment of the present invention.

In FIG. 6, first, second, third and fourth electrodes 210a, 210b, 210c and 210d may be connected to one power supply "V." The first and fourth electrodes 210a and 210d may be combined with each other, and the second and third electrodes 210b and 210c may be combined with each other.

FIGS. 7A to 7D are schematic cross-sectional views showing a process of forming a polycrystalline silicon thin film transistor according to an embodiment of the present invention.

Figure 7A:
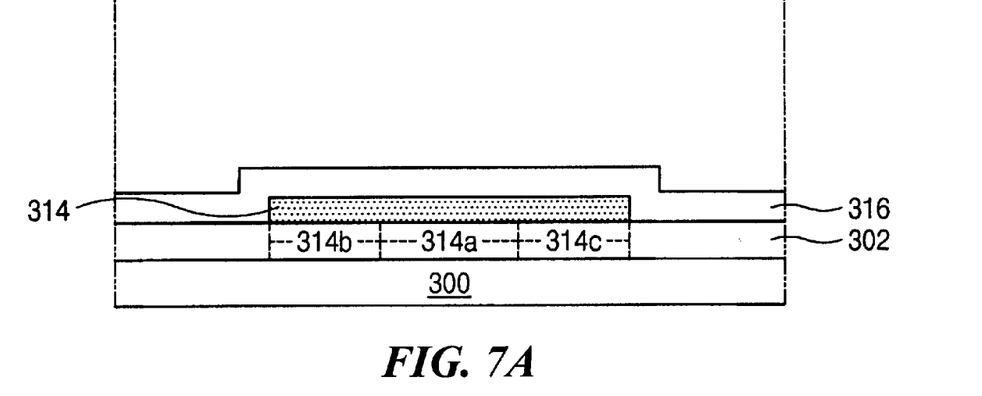
FIGS. 7A to 7D are schematic cross-sectional views showing a process of forming a polycrystalline silicon thin film transistor according to an embodiment of the present invention.

In FIG. 7A, a buffer layer 302 may be formed on a substrate 300, and a polycrystalline silicon layer (not shown), obtained through a crystallization process according to the present invention, may formed on the buffer layer 302. An active layer 314 having an island shape may be obtained by patterning the polycrystalline silicon layer. A gate insulating layer 316 may be formed on the active layer 314 by depositing one of silicon nitride ($SiN_x$) and silicon oxide ($SiO_2$). The active layer 314 may include a channel region 314a, and source and drain regions 314b and 314c. The channel region 314a may function as a channel for carriers of a thin film transistor (TFT), and the source and drain regions 314b and 314c may function as ohmic contact layers for source and drain electrodes of the TFT.

Figure 7B:
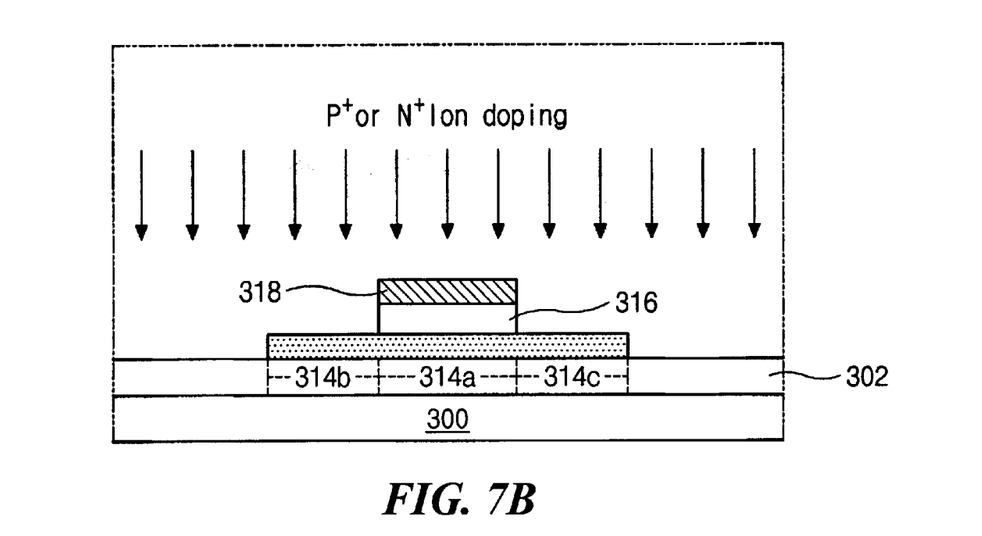

In FIG. 7B, a gate electrode 318 may be formed on the gate insulating layer 316 corresponding to the channel region 314a by depositing and patterning a conductive metallic material such as aluminum (Al) and Al alloy. Next, the source and drain regions 314b and 314c may be doped with impurities of N type or P type. The channel region 314a is not doped by using the gate electrode 318 as a doping mask. When an ion implantation method is used for doping the source and drain regions 314b and 314c, the source and drain regions 314b and 314c including their top surfaces may be severely damaged and the doped impurities do not diffuse into the entire source and drain regions 314b and 314c sufficiently. Accordingly, a subsequent activation process of heating with a specific temperature may be necessary to cure the source and drain regions 314b and 314c and sufficiently diffuse the doped impurities into the entire source and drain regions 314b and 314c. Before the step of doping, the gate insulating layer 316 may be etched by using the gate electrode 318 as an etching mask.

Figure 7C:
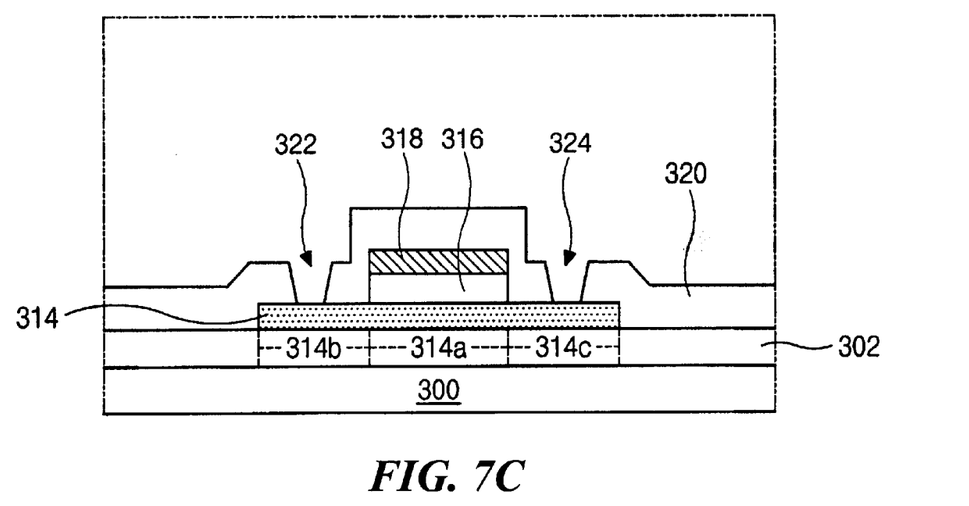

In FIG. 7C, an interlayer insulating layer 320 may be formed on the gate electrode 318 and source and drain regions 314b and 314c by depositing one of silicon nitride ($SiN_x$) and silicon oxide ($SiO_2$). Next, source and drain contact holes 322 and 324 may be formed by patterning the interlayer insulating layer 320. The source and drain contact holes expose the source and drain regions 314b and 314c, respectively.

Figure 7D:
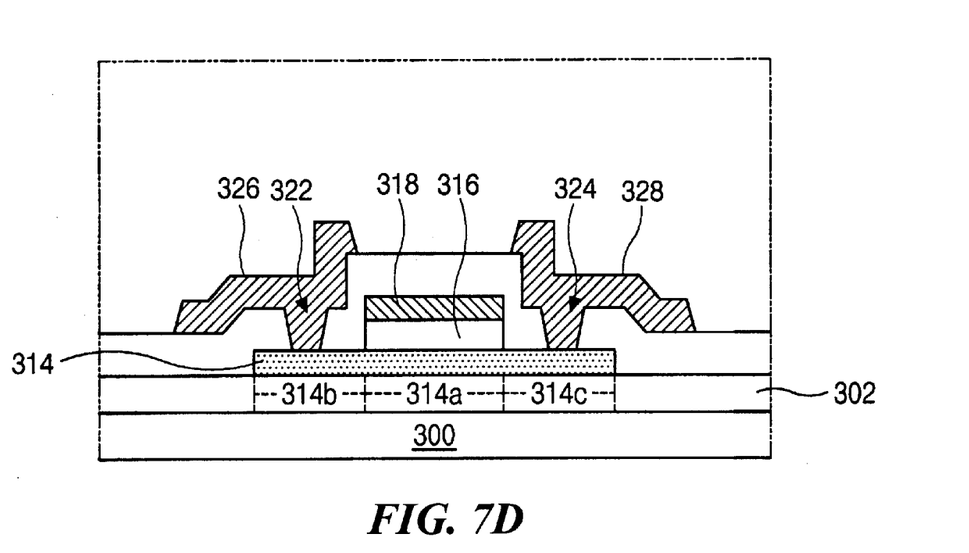

In FIG. 7D, source and drain electrodes 326 and 328 may be formed on the interlayer insulating layer 320 by depositing and patterning one of a conductive metal group including copper (Cu), tungsten (W), molybdenum (Mo), chromium (Cr), tantalum (Ta) and titanium (Ti). The source electrode 326 may be connected to the source region 314b through the source contact hole 322, and the drain electrode 328 may be connected to the drain region 314b through the drain contact hole 324.

A polycrystalline silicon layer obtained through a two-directional FE-MIC method of FIGS. 2A to 6 has a uniform grain distribution. Therefore, when a polycrystalline silicon TFT uses a polycrystalline silicon layer obtained through a two-directional FE-MIC method of FIGS. 2A to 6, the carrier mobility and the OFF current of the polycrystalline silicon TFT are improved.

While the present invention was described using two pairs of electrodes to develop two different electric fields to crystallize the amorphous silicon layer, additional pairs of electrode may be used to create electrical fields in additional directions to further crystallize the amorphous silicon layer.

It will be apparent to those skilled in the art that various modifications and variations can be made in the method of manufacturing a polycrystalline silicon layer of the present invention without departing from the spirit or scope of the invention. Thus, it is intended that the present invention cover the modifications and variations of this invention provided they come within the scope of the appended claims and their equivalents.

What is claimed is:

1. A method of forming a polycrystalline silicon layer from an amorphous silicon layer on a substrate, comprising:

depositing a catalyst metal on the amorphous silicon layer;

disposing first and second electrodes contacting the amorphous silicon layer along a first direction;

heating the amorphous silicon layer under a first temperature and simultaneously applying a first voltage to the first and second electrodes to form a first crystallized amorphous silicon layer;

disposing third and fourth electrodes contacting the first crystallized amorphous silicon layer along a second direction, the second direction being different from the first direction; and heating the first crystallized amorphous silicon layer under a second temperature and simultaneously applying a second voltage to the third and fourth electrodes to form a secondly crystallized amorphous silicon layer.

2. The method according to claim 1, wherein each of the first and second temperatures is within a range of about 450° C. to about 600° C.

3. The method according to claim 1, wherein the first direction is substantially perpendicular to second direction.

4. The method according to claim 1, wherein there is a gap between the first, second, third, and fourth electrodes.

5. The method according to claim 1, wherein the first and second voltages are less than.

6. The method according to claim 1, wherein the first and second voltages are within the range of 500 V to 2000 V.

7. The method according to claim 1, wherein the first voltage is the same value as the second voltage.

8. A method of forming a polycrystalline silicon layer on an amorphous silicon layer on a substrate, comprising:

depositing a catalyst metal on the amorphous silicon layer;

disposing first, second, third and fourth electrodes contacting the amorphous silicon layer such that the first and second electrodes are disposed along a first direction and the third and fourth electrodes are disposed along a second direction, the second direction being different from the first direction; and heating the amorphous silicon layer under a temperature and simultaneously applying a first voltage to the first and second electrodes and a second voltage to the third and fourth electrodes.

9. The method according to claim 8, wherein the first direction is substantially perpendicular to second direction.

10. The method according to claim 8, wherein there is a gap between the first, second, third, and fourth electrodes.

11. The method according to claim 8, wherein the first and second voltages are less than 10,000 V.

12. The method according to claim 8, wherein the first and second voltages are within the range of 500 V to 2000 V.

13. The method according to claim 8, wherein the first voltage is applied from a first power supply connected to the first and second electrodes, wherein the second voltage is applied from a second power supply connected to the third and fourth electrodes.

14. The method according to claim 8, wherein the first voltage is the same value as the second voltage.

15. The method according to claim 14, wherein the first and second voltages are applied from a power supply connected to the first, second, third and fourth electrodes.

16. The method according to claim 8, wherein the temperature is within a range of about 450° C. to about 600° C.

17. A method of forming a polycrystalline silicon thin film transistor, comprising:
   forming an amorphous silicon layer on a substrate;
   depositing a catalyst metal on the amorphous silicon layer;
   disposing first and second electrodes contacting the amorphous silicon layer along a first direction;
   heating the amorphous silicon layer under a first temperature and simultaneously applying a first voltage to the first and second electrodes to form a first crystallized amorphous silicon layer;
   disposing third and fourth electrodes contacting the first crystallized amorphous silicon layer along a second direction, the second direction being different from the first direction;
   heating the first crystallized amorphous silicon layer under a second temperature and simultaneously applying a second voltage to the third and fourth electrodes to form a polycrystalline silicon layer;
   patterning the polycrystalline silicon layer to form an active layer;
   forming a gate insulating layer on the active layer;
   forming a gate electrode on the gate insulating layer;
   doping the active layer with impurities to form source and drain regions in the active layer;
   forming an interlayer insulating layer on the gate electrode, the interlayer insulating layer having source contact hole exposing the source region and drain contact hole exposing the drain region; and
   forming source and drain electrodes on the interlayer insulating layer, the source electrode being connected to the source region through the source contact hole, the drain electrode being connected to the drain region through the drain contact hole.

18. The method according to claim 17, further comprising forming a buffer layer between the substrate and the amorphous silicon layer.

19. The method according to claim 17, wherein the buffer layer includes one of silicon nitride ($SiN_x$) and silicon oxide ($SiO_2$).

20. The method according to claim 17, wherein each of the first and second temperatures is within a range of about 450° C. to about 600° C.

21. The method according to claim 17, wherein the first direction is substantially perpendicular to second direction.

22. The method according to claim 17, wherein there is a gap between the first, second, third, and fourth electrodes.

23. The method according to claim 17, wherein the first and second voltages are less than 10,000 V.

24. The method according to claim 17, wherein the first and second voltages are within the range of 500 V to 2000 V.

25. The method according to claim 17, wherein the first voltage is the same value as the second voltage.

26. A method of forming a polycrystalline silicon thin film transistor, comprising:
   forming an amorphous silicon layer on a substrate;
   depositing a catalyst metal on the amorphous silicon layer;
   disposing first, second, third and fourth electrodes contacting the amorphous silicon layer such that the first and second electrodes are disposed along a first direction and the third and fourth electrodes are disposed along a second direction, the second direction being different from the first direction;
   heating the amorphous silicon layer under a temperature and simultaneously applying a first voltage to the first and second electrodes and a second voltage to the third and fourth electrodes to form a polycrystalline silicon layer;
   patterning the polycrystalline silicon layer to form an active layer;
   forming a gate insulating layer on the active layer;
   forming a gate electrode on the gate insulating layer;
   doping the active layer with impurities to form source and drain regions in the active layer;
   forming an interlayer insulating layer on the gate electrode, the interlayer insulating layer having source contact hole exposing the source region and drain contact hole exposing the drain region; and
   forming source and drain electrodes on the interlayer insulating layer, the source electrode being connected to the source region through the source contact hole, the drain electrode being connected to the drain region through the drain contact hole.

27. The method according to claim 26, further comprising forming a buffer layer between the substrate and the amorphous silicon layer.

28. The method according to claim 26, wherein the buffer layer includes one of silicon nitride ($SiN_x$) and silicon oxide ($SiO_2$).

29. The method according to claim 26, wherein the first voltage is applied from a first power supply connected to the first and second electrodes, wherein the second voltage is applied from a second power supply connected to the third and fourth electrodes.

30. The method according to claim 26, wherein the first voltage is the same value as the second voltage.

31. The method according to claim 30, wherein the first and second voltages are applied from a power supply connected to the first, second, third and fourth electrodes.

32. The method according to claim 26, wherein the temperature is within a range of about 450° C. to about 600° C.

33. The method according to claim 26, wherein the first direction is substantially perpendicular to second direction.

34. The method according to claim 26, wherein there is a gap between the first, second, third, and fourth electrodes.

35. The method according to claim 26, wherein the first and second voltages are less than 10,000V.

36. The method according to claim 26, wherein the first and second voltages are within the range of 500 V to 2000 V.

* * * * *